United States Patent
Kishimoto et al.

(10) Patent No.: US 6,242,686 B1
(45) Date of Patent: Jun. 5, 2001

(54) PHOTOVOLTAIC DEVICE AND PROCESS FOR PRODUCING THE SAME

(75) Inventors: Katsushi Kishimoto, Ikoma-gun; Takanori Nakano, Kitakatsuragi-gun; Hitoshi Sannomiya, Osaka; Katsuhiko Nomoto, Kashihara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/330,165

(22) Filed: Jun. 11, 1999

(30) Foreign Application Priority Data

Jun. 12, 1998 (JP) .................................. 10-165329

(51) Int. Cl.$^7$ .......................... H01L 31/075; H01L 31/20
(52) U.S. Cl. .................... 136/255; 136/249; 136/258; 136/261; 257/464; 257/431; 257/53; 257/55; 257/463; 438/57; 438/74; 438/96
(58) Field of Search ................... 136/255, 249 TJ, 136/258 AM, 258 PC, 249 MS, 261; 257/464, 431, 53, 55, 463; 438/57, 74, 96, 97

(56) References Cited

U.S. PATENT DOCUMENTS

| 4,321,420 | 3/1982 | Kaplan et al. |
| 4,612,559 | * 9/1986 | Hitotsuyanagi et al. ............ 136/258 |
| 4,705,912 | * 11/1987 | Nakashima et al. ................. 136/258 |
| 4,718,947 | 1/1988 | Arya . |
| 4,721,535 | * 1/1988 | Itoh et al. ............................ 136/258 |
| 4,737,196 | 4/1988 | Yukimoto . |
| 5,419,783 | * 5/1995 | Noguchi et al. ..................... 136/258 |
| 5,507,881 | * 4/1996 | Sichanugrist et al. .............. 136/258 |

FOREIGN PATENT DOCUMENTS

| 0 024 378 A1 | 3/1981 | (EP) . |
| 0 747 974 A2 | 12/1996 | (EP) . |
| 0 828 301 A3 | 3/1998 | (EP) . |
| 3-40515 B2 | 6/1991 | (JP) . |
| 3-63229 B2 | 9/1991 | (JP) . |
| 4/321277 | 11/1992 | (JP) . |
| 7/022638 | 1/1995 | (JP) . |

* cited by examiner

Primary Examiner—Alan Diamond
(74) Attorney, Agent, or Firm—Nixon & Vanderhye P.C.

(57) ABSTRACT

A photovoltaic device have a pin junction of a p-layer, an i-layer and an n-layer, wherein the p-layer includes a first p-layer and a second p-layer thereover, the first p-layer having a thickness of 5 nm or less and being uniformly doped with a p-type impurity, and the second p-layer being formed by decomposition of a gas which does not positively incorporate a p-type impurity.

14 Claims, 8 Drawing Sheets

— The gradedly H₂ plasma-treated layer

-- The H₂ plasma-treated layer

PHOTOVOLTAIC DEVICE AND PROCESS FOR PRODUCING THE SAME

CROSS-REFERENCE TO RELATED APPLICATION

This application is related to Japanese application No. HEI 10(1998)-165329 filed on Jun. 12, 1998, whose priority is claimed under 35 USC § 119, the disclosure of which is incorporated by reference in its entirety.

BACKGROUND OF THE INVENTION

1. Field of the Invention

The present invention relates to a photovoltaic device and a process for producing the same. More particularly, the invention relates to a photovoltaic device having a pin junction and a production process therefor.

2. Description of Related Art

In the history of development of thin film solar cells having pin junctions, various attempts have been made with regard to doped layers on a photoreceptive side since these layers are important factors for improving conversion efficiency ($\eta$).

Particularly, a variety of studies are being made about a p-layer, which is one of the doped layers on the photoreceptive side and functions as an hydrogenated amorphous silicon window layer. Since the p-layer is not a photoelectric conversion layer, the p-layer must possess a characteristic of absorbing only a small amount of light. At the same time, the p-layer must also have a high electrical conductivity and good i/p interface characteristics. A variety of studies are being made in order to achieve a p-layer which can satisfy these contradictory characteristics.

For example, Japanese Examined Patent Publications Nos. HEI 3(1991)-40515 and HEI 3(1991)-63229 disclose the use of an a-SiC:H (hydrogenated amorphous silicon carbide) film doped with boron atoms as the p-layer. In these publications, the p-layer is formed by decomposing $B_2H_6$ gas together with a mixture gas of silane or a silane derivative (e.g., $SiH_4$), a hydrocarbon (e.g., $CH_4$), an inert gas (e.g., Ar, He) and the like by glow discharge. Other generally known methods of forming the p-layer include a plasma chemical vapor deposition (plasma CVD).

However, where $B_2H_6$ gas is mixed with gas sources, boron atoms extract hydrogen atoms terminating bonds of silicon atoms, etc., in the amorphous layer. That gives rise to a large number of unbonded bonds, which are referred to as dangling bonds. For this reason, if the boron-doped amorphous film formed by the above-mentioned method is used as a window p-layer for a solar cell, the light absorption in the p-layer may rise.

In order to suppress a rise in the light absorption, carbon atoms are introduced in the layer up to several ten percents. However, an increase in the number of carbon atoms may bring about deterioration of the quality of the layer. As a result, the electrical conductivity declines and the inner resistance of the entire device increases.

Thus a technical problem exists in that to provide a desired conductivity which does not give rise to series resistance for cell characteristics will lead to a non-negligible increase in the light absorption and therefore a sufficient photoelectric current will not be ensured.

By the plasma CVD, boron atoms in plasma increase dangling bonds also on the surface of the film, and thereby gives rise to a large number of recombination levels at a p-i interface, As a result, the conversion efficiency is affected adversely.

For example, in the case where a boron-doped SiC film is used as a p-layer, the film has a poor connection with the photoelectric conversion layer and becomes a recombination center of generated photo-carriers. Therefore a sufficient open-circuit voltage (Voc) and a satisfactory fill factor (F.F.) cannot be ensured.

To cope with these drawbacks, it is generally known to place an amorphous film in which the amount of carbon atoms are gradually changed or an intrinsic SiC:H film, as a buffer layer at the p-i interface for reducing adverse effects on solar cell characteristics.

However, such buffer layers are poor in electrical conductivity and can cause an increase in the inner resistance of the device. Eventually, it is impossible to avoid a decline in the F.F.

On the other hand, as regards the formation of the player, Japanese Unexamined Patent Publication HEI 7(1995) 22638 proposes a process of forming a hydrogenated amorphous p-type silicon layer by forming a hydrogenated amorphous boron (a-B:H) layer and subsequently disposing an hydrogenated amorphous silicon layer thereon, and Appl. Phys. 36 (1997) 467 proposes a process of forming a p-layer by forming a hydrogenated amorphous boron layer and subsequently forming an amorphous carbon layer (a-C) thereon.

However, it is still difficult to reduce the light absorption in the hydrogenated amorphous boron layer sufficiently.

In usual cases, used as a substrate for forming photovoltaic devices is a glass substrate having thereon an electrically conductive transparent oxide film, for example, of $SnO_2$ or ZnO with projections and depressions. In the case where the pin junction is formed on such an electrically conductive transparent oxide film, resistance increases at the interface between the electrically conductive transparent oxide film and the hydrogenated amorphous boron layers proposed by Japanese Unexamined Patent Publication HEI 7(1995)-22638 and Appl. Phys. 36 (1997) 467. Therefore, it is still difficult to obtain good cell characteristics.

So-called tandem-type photovoltaic devices are also generally known. The tandem-type photovoltaic devices are constructed to have a plurality of layered pin junctions in order to utilize spectra of light of the sun efficiently to improve a photoelectric conversion rate. In such photovoltaic devices, by optionally setting optical band gaps in photoelectric conversion layers of pin junctions, photocurrent generated in each pin junction can be efficiently utilized. In other words, in the tandem-type photovoltaic device, which is a device having two or three or more of such pin junctions connected to each other, an interlayer p-layer which is adjacent to an n-layer is usually formed as a laminate of a contact layer of a highly doped a-Si:H film for obtaining an ohmic contact with the underlying adjacent n-layer and a wide gap silicon alloy film, e.g., an a-SiC:H film, an a-SiO:H film, etc.

However, interfaces inevitably exist between p-layers and adjacent n-layers in intermediate layers. Accordingly, presently, the quality of films must be sacrificed for obtaining good ohmic contact, and recombination layers of about 3 nm thickness which have a large light absorption must be inserted at the interfaces. Moreover, there is a problem that the F.F. of the photovoltaic device declines since the light absorption by the contact layer which is not an active layer brings about a large loss and since the series resistance of the gap-widened silicon alloy film of a-SiC:H, a-SiO:H or the like becomes too large to neglect.

Thus, none of the above-described conventional methods has not achieved a technique which satisfies the contradictory characteristics required for the p-layer and the tandem-type photovoltaic device having a plurality of laminated pin junctions. The contradictory characteristics are a low light absorption, a high electrical conductivity and good interface characteristics both to the electrically conductive transparent oxide film or the n-type hydrogenated amorphous silicon layer (or a microcrystalline silicon layer) and to the photoelectric conversion layer.

SUMMARY OF THE INVENTION

Under these circumstances, an object of the present invention is to provide a photovoltaic device having a pin junction of a p-layer, an i-layer and an n-layer, wherein the p-layer includes a first p-layer and a second p-layer thereover, the first p-layer having a thickness of 5 nm or less and being uniformly doped with a p-type impurity, and the second p-layer being formed by decomposition of a gas which does not positively incorporate a p-type impurity.

Another object of the present invention is to provide a process for producing a photovoltaic device having a pin junction. The process comprises the steps of:

forming a first p-layer which has a thickness of 5 nm or less and is uniformly doped with a p-type impurity, forming a second p-layer by decomposition of a gas which does not positively incorporate a p-type impurity, thereby to obtain the p-layer, forming the i-layer and n-layer in this order.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
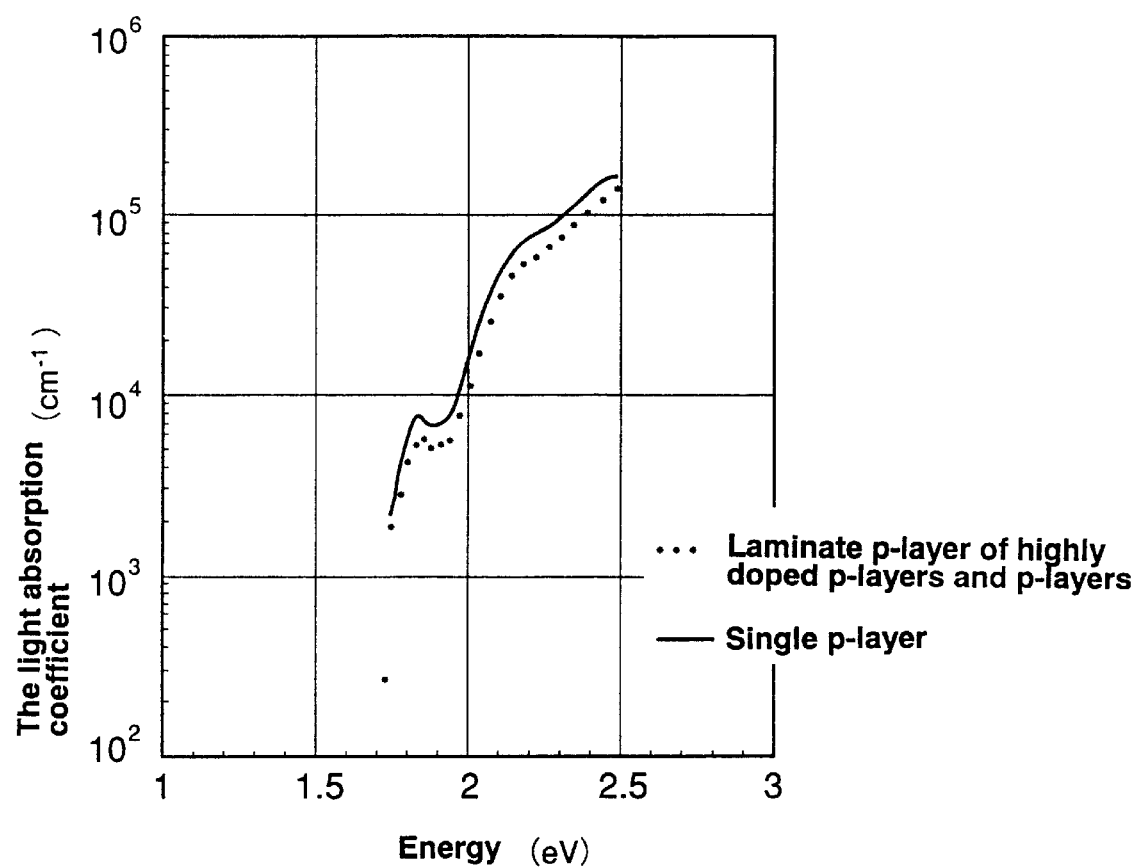
FIG. 1 is a graphic representation of light absorption of p-layers for use in a photovoltaic device in accordance with the present invention.

The photovoltaic device of the present invention has a pin junction and may be comprised mainly of a transparent electrode layer; a p-layer including a first p-layer and a second p-layer thereover, the first p-layer having a thickness of 5 nm or less and being uniformly doped with a p-type impurity, and the second p-layer being formed by decomposition of a gas which does not positively incorporate a p-type impurity; an i-layer; an n-layer; and a rear electrode layer. These electrode layers and the pin junction are preferably formed on a substrate.

The substrate usable for the photovoltaic device of the present invention is not particularly limited to any substrates as far as they are usually used in the art. Examples thereof are substrates of various materials including substrates of metals such as stainless steel, aluminum, copper and zinc; substrates of glass; substrates of resins such as polyimide, polyethylene polyterephthalate (PET), polyether sulfone (PES) and Teflon; substrates of metals coated with resins; and substrates of resins with metal layers formed thereon, among which transparent substrates are preferred. The substrate may be formed in conjunction with an insulating film, an electrically conductive film or a wiring layer (e.g., of a metal or a semiconductor), a buffer layer or a combination thereof, depending on how the support substrate is utilized. The thickness of the substrate is not particularly limited, but may be about 0.1 to 30 mm so that the substrate has a suitable strength and weight. The substrate may have projections and depressions on its surface.

The transparent electrode layer for use in the photovoltaic device of the present invention may be made of an electrically conductive oxide such as ZnO, ITO or $SnO_2$. These materials for the electrode may be formed in a single layer or in a laminated layer. The thickness of the transparent electrode layer may be selected as appropriate, for example, about 200 to 2,000 nm. Projections and depressions may be formed on the surface of the transparent electrode layer. The projections and depressions may have a level difference of about 0.1 to 1.2 $\mu$m, that is, about a wavelength of visible-range light, and a pitch of about 0.1 to 10 $\mu$m.

In the p-layer of the photovoltaic device of the present invention, laminated are the first p-layer which has a thickness of 5 nm or less and is uniformly doped with the p-type impurity (e.g., boron) and the second p-layer which is formed by decomposing the gas which does not positively incorporate of a p-type impurity. With this construction, the p-layer can maintain good interface characteristics with the conductive transparent layer formed thereunder and at the same time the quality of the p-layer can be prevented from deterioration, which might otherwise be caused by the hydrogen extracting effect of the p-type impurity.

In the above-described p-layer, both the first and second p-layers may be formed of a semiconductor, especially an amorphous semiconductor such as hydrogenated amorphous silicon (a-Si:H), hydrogenated amorphous germanium (a-Ge:H), hydrogenated amorphous silicon germanium (a-SiGe:H) or the like. The first and second p-layer are not necessarily formed of the same type of semiconductor, but preferably they may both be formed of a-Si:H.

A thickness of the first p-layer of 5 nm or less means that the first p-layer is so thin that its optical absorption can be neglected. The first p-layer may be a film in one or more semiconductor atomic layer, for example. The first p-layer may preferably have a uniform thickness all over the surface, but this layer may be formed like an island on the surface of the transparent electrode layer. Further, that the first p-layer is uniformly doped with the p-type impurity means that the whole first p-layer is doped with the p-type impurity in a certain concentration. For example, in the case where the first p-layer is formed of a silicon film, carrier density may be sufficient if silicon atoms are present $10^{22}$ atom/cm$^2$ in a one-atomic layer and the p-type impurity is present $10^{18}$ atom/cm$^2$ or higher in the layer. This means that one carrier atom is enough for 10,000 silicon atoms. Therefore, the thickness of the layer and the concentration of the impurity may be selected so that the carrier, for example, acceptor such as boron atoms, will exist in such an amount that the above-mentioned carrier density is ensured.

With the above-described construction of the first player, a sufficient internal electric field can be produced in the i-layer described later. A relatively large open-circuit voltage can be ensured. The increase of the light absorption can be suppressed, and therefore, a relatively large short-circuit current can be obtained.

The surface of the first p-layer may be treated with a plasma as described later. This plasma treatment of the surface provides good p-i interface characteristics.

As regards the second p-layer, the p-layer formed by decomposition of the gas which does not positively incorporate of a p-type impurity means that the second p-layer is first formed as an i-layer (as a second layer) by decomposition of the gas not containing a p-type impurity, but that at the same time as the i-layer is formed or thereafter, the p-type impurity diffuses from the underlying first p-layer and/or mixes into the second p-layer from a film-forming atmosphere, so that the i-layer turns into a p-layer. Accordingly the concentration of the impurity in the second p-layer is lower than that in the first p-layer. In the second p-layer, the p-type impurity may be uniformly diffused but may preferably be diffused in such a manner that the concentration thereof decreases gradually from the first p-layer toward the i-layer described later. In the case where the concentration of the p-type impurity in the second p-layer decreases gradually toward the i-layer, the light absorption coefficient may increase gradually toward the i-layer. In other words, the extraction of hydrogen atoms from the second p-layer by the p-type impurity can be suppressed, so that the light absorption can be reduced gradually and the quality of the second p-layer can be prevented from debasing. The second p-layer may be composed of a single layer, but may be composed of a plurality of films formed under varied film-forming conditions. The thickness of the second p-layer is not particularly limited, but may be about 1 to 200 nm, for example. In the case where the second p-layer is formed of a plurality of films, each film preferably has a thickness of about 1 to 30 nm.

The surface of the second p-layer may be subjected to a plasma treatment as described later. In the case where the second p-layer is formed of a plurality of films, the surface of each film may be subjected to the plasma treatment. It is noted that the surface of all the films may be subjected to the plasma treatment or the surface of some of the films may be subjected to the plasma treatment.

The i-layer and n-layer in the photovoltaic device of the present invention are not particularly limited, and any i-layers and n-layers that are usually used for pin junctions of photovoltaic devices can be used. For example, the i-layer and n-layer are both formed of amorphous layers as mentioned above. The i-layer is not doped with any impurity that acts as a carrier. The n-layer may be doped with an impurity which acts as a donor such as arsenic, phosphorus or the like in a concentration of $10^{18}$ to $10^{19}$/cm$^3$. The thickness of the i-layer and n-layer may be selected as appropriate in view of energy intended to be obtained from the photovoltaic device, the concentration of the impurities in the p-layer and n-layer, and the like, and may be about 100 to 600 nm and 30 to 100 nm, respectively, for example.

The rear electrode layer may be formed of any conductive materials as far as they are used in the art. Examples thereof include metals such as gold, platinum, silver, copper and aluminum and conductive oxides as mentioned above. The thickness thereof may be selected as appropriate depending on how the photovoltaic device is-to be used.

Also in the present invention, the photovoltaic device may be a tandem-type photovoltaic device which has at least two pin junctions. In this case, the photovoltaic device is mainly composed of a transparent electrode layer, a first pin junction, a second pin junction having a p-layer adjacent to an n-layer of the first pin junction, and a rear electrode layer, which are disposed sequentially from a light-incident side. The second pin junction includes a p-layer, an i-layer and an n-layer. The p-layer has a hydrogenated amorphous silicon layer (a first player) having a thickness of 5 nm or less in which the p-type impurity predominates over a little amount of a coexisting n-type impurity and a hydrogenated amorphous silicon layer (a second p-layer) in which the concentration of an impurity decreases as this hydrogenated amorphous silicon layer becomes nearer to the i-layer. The i-layer and the n-layer form a pin junction with the p-layer. It is noted that the photovoltaic device of the present invention may further include a third, a forth, . . . pin junctions, but not all of these pin junctions need to include the above-described p-layer having the first p-layer and the second p-layer. At least one of the pin junctions must include the above-described p-layer having the first p-layer and the second p-layer. Especially, all the pin junctions may preferably have the first and the second p-layer.

In the photoelectric conversion of the present invention, not all of the n-layer, i-layer and p-layer which form the pin junction need to be formed of hydrogenated amorphous silicon. At least the n-layer and i-layer need to be formed of hydrogenated amorphous silicon. Further, the photovoltaic device may optionally have a buffer layer, an intermediate layer, a conductive layer, an insulating layer and/or the like between the transparent electrode layer, p-layer, i-layer, n-layer and rear electrode layer.

In the process of producing the photovoltaic device of the present invention, the first p-layer which has a thickness of 5 nm or less and is uniformly doped with the p-type impurity may be formed on the substrate which is preferably provided with the transparent electrode layer on its surface.

The first p-layer may be formed by a known method, for example, a CVD method or a plasma CVD using gas sources like $SiH_4$, $GeH_4$, $CH_4$, $H_2$, Ar and He, or the like. The p-type impurity (e.g., boron) for the first p-layer may be doped while-the first player is being formed by mixing $B_2H_6$ gas into the gas sources or may be doped by ion implantation or thermal diffusion after the first p-layer is formed.

The surface of the first p-layer may be subjected to a plasma treatment as described above. The plasma treatment at this stage may be performed using $H_2$, He, Ar or the like. In the case where the first p-layer is formed of a-Si:H film, conditions for the plasma treatment may be set as shown in Table 1, for example.

TABLE 1

| Gas Type | Gas Flow Rate (sccm) | Applied Pressure (torr) | Applied Power (W) | Treatment Time (minutes) |
| --- | --- | --- | --- | --- |
| $H_2$ | 10–500 | 0.1–1 | 10–1000 | 1–30 |
| He | 10–500 | 0.1–0.8 | 10–500 | 1–30 |
| Ar | 10–500 | 0.2–1 | 10–500 | 1–30 |

If germanium is the major element of the first p-layer, it is suitable to set the power at a low level.

This plasma treatment raises the light absorption coefficient in the first p-layer, that is, the increase of the light absorption in the first p-layer can be suppressed. Therefore, a relatively high short-circuit current can be obtained.

Subsequently, the second p-layer is formed on the first p-layer by decomposition of a gas not containing a p-type impurity. The second p-layer may be formed in the same manner as the first p-layer is formed, except that the gas sources do not contain a p-type impurity.

By forming the second p-layer in this manner, though the second p-layer is not positively doped with a p-type impurity, the p-type impurity in the underlying first p-layer diffuses into the second p-layer. As a result, the second p-layer contains the p-type impurity therein. If the first and second p-layers are formed by a film-forming apparatus, for example, a plasma CVD apparatus, and the second p-layer is formed subsequently to the formation of the first p-layer in the same chamber, the p-type impurity which has been fed for forming the first p-layer and remains in an atmosphere mixes into the second p-layer. As a result, the second p-type layer contains the p-type impurity.

The second p-layer may preferably be subjected to a plasma treatment. This plasma treatment may preferably be carried out on the surface of the formed second p-layer and/or carried out on the second p-layer under formation every time the second p-layer gains a predetermined thickness. The predetermined thickness here may be about 1 to 30 nm, for example. In the case where the plasma treatment is repeatedly performed at every predetermined thickness, the treatment time and/or the applied power is/are preferably decreased gradually over the repeated treatments. By performing the plasma treatment in this way, it is possible to increase the light absorption coefficient in the second p-layer gradually toward the i-layer. That means, the increase of the light absorption of the second p-layer can be suppressed gradually. Therefore the short-circuit current can be improved and also a decline in Voc and F.F. can be prevented.

The formation of the second p-layer may be carried out in the same chamber of the film-forming apparatus where the first p-layer has been formed. In this case, the light absorption coefficient can be increased, that is, the increase of the light absorption of the first and second p-layers can be suppressed, without need to design a particular doping profile. As a result, manufacturing costs may be reduced.

The second p-layer is not formed necessarily in the same chamber as the first p-layer but may be formed in a different chamber. In this case, since there is not the possibility that the p-type impurity may diffuse in the second p-layer in excess, the inner electric field in the second p-layer may be controlled easily.

The photovoltaic device and the process for producing the same of the present invention is now described in further detail by way of embodiments with reference to the accompanying drawings. The embodiments, however, should not be construed to limit the scope of the invention.

Embodiment 1

Evaluation of Light Absorption of p-layer

First, a transparent glass substrate was placed on a substrate support in a chamber of a plasma CVD apparatus. Gas sources of $SiH_4:B_2H_6:H_2=1:0.1:20$ were supplied onto the transparent glass substrate at a flow rate of 200 sccm. A film was formed under an atmosphere of 200° C. at an applied power of 200 W for 10 minutes with maintaining the temperature of the substrate at 200° C., thereby to obtain a highly doped p-type a-Si:H layer in which boron was doped in a high concentration. The thickness of the highly doped p-type a-Si:H layer thus obtained was set to about 2 nm, such a thickness that the light absorption of the layer was negligible.

Subsequently, an a-Si:H layer not doped with boron was formed to a thickness of about 10 nm using gas sources of $SiH_4:H_2=100:200$ sccm in the same chamber. At this time, the a-Si:H layer turned into a p-type layer due to the diffusion of boron from the underlying highly doped p-type a-Si:H layer and/or the mixing of boron from the atmosphere.

By repeating these steps, a p-layer having a total thickness of 300 nm was formed which was composed of highly doped a-Si:H layers each of about 2 nm thickness and a-Si:H layers each of about 10 nm thickness which were alternately laminated.

For comparison, a single p-layer of 300 nm thickness was formed on a transparent glass substrate using mixed gas sources of $SiH_4:B_2H_6:H_2=100:5:200$ separately from the above-mentioned laminate p-layer.

The light absorption and conductivity of the obtained two kinds of p-layers were measured. The results are shown in Table 1.

The light absorption of the laminate p-layer of highly doped p-layers and p-layers is smaller than that of the typical single p-layer, as clearly shown in FIG. 1. The reason is considered to be that, in the laminate p-layer, the boron's effect of extracting hydrogen atoms did not take place during the formation thereof.

The p-layers had almost the same conductivity of about $5 \times 10^{-4}$ S/cm.

In the above embodiment, a unit of one highly doped p-layer and one p-layer in the laminate p-layer was set to be about 12 nm in thickness and the highly doped p-layers of 2 nm thickness were present with intervals of about 10 nm. In the case where one p-layer (the second p-layer) was about 30 nm or thinner, the effect of reducing the light absorption was observed with regard to laminate p-layers formed at 200° C., which exhibited a conductivity similar to that of the above embodiment.

Embodiment 2

Photovoltaic Device and it Production Process

Figure 2:
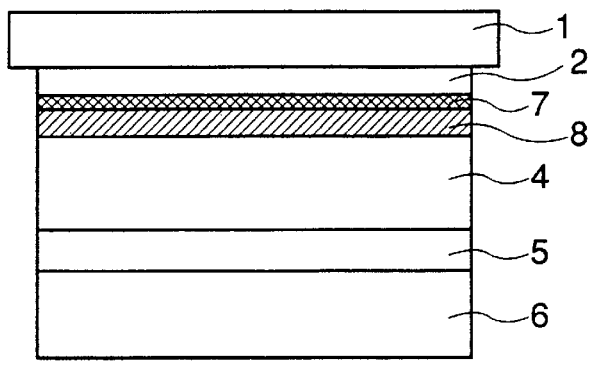
FIG. 2 is a schematic sectional view of the major part of an exemplary photovoltaic device in accordance with the present invention.

Referring to FIG. 2, the photovoltaic device of this embodiment was constructed to have a transparent electrode layer 2, a highly doped p-type a-Si:H layer 7, a p-type a-Si:H layer 8, an i-layer 4, an n-layer 5 and a rear electrode layer 6 sequentially formed on a transparent glass substrate 1.

A process for producing the above-mentioned photovoltaic device is now explained.

First, a ZnO film having gentle projections and depressions of about 300 nm level difference was formed to a thickness of about 800 nm on the transparent glass substrate 1 by sputtering, thereby to form a transparent electrode layer 2.

Subsequently, the resulting transparent glass substrate 1 was placed on a substrate support in a p-layer forming chamber of a deposition apparatus. Mixed gas sources of $SiH_4:B_2H_6:H_2=1:0.1:20$ were supplied onto the substrate 1 at a flow rate of 200 sccm. A film was formed under an atmosphere of 200° C. at an applied power of 200 W for 10 minutes with maintaining the temperature of the substrate at 200° C., thereby to obtain a highly doped p-type a-Si:H layer 7 of about 2 nm thickness doped with boron in a high concentration, as the first p-layer.

Subsequently, an a-Si:H layer 8 not doped with boron was formed to a thickness of about 10 nm in the same chamber. At this time, the a-Si:H layer turned into a p-type a-Si:H layer (the second p-layer) due to the diffusion of boron from the underlying highly doped p-type a-Si:H layer and/or the mixing of boron from the atmosphere.

Next, an i-layer 4 of about 200 nm thickness was formed on the a-Si:H layer 8 in an i-layer forming chamber using gases of $SiH_4:H_2=200:500$ at an applied power of 100 W. Further, an n-layer 5 of about 30 nm thickness was formed on the i-layer 4 in an n-layer forming chamber using gases of $SiH_4:H_2:PH_3=10:500:3$ at an applied power of 100 W.

Thereafter, an Ag film of 500 nm thickness was formed in a sputtering system under a temperature of 200° C. thereby to form a rear electrode.

In the above-described way, produced was a photovoltaic device shown in FIG. 2 which had a pin junction.

An I-V characteristic of the produced photovoltaic device was evaluated.

Figure 4:
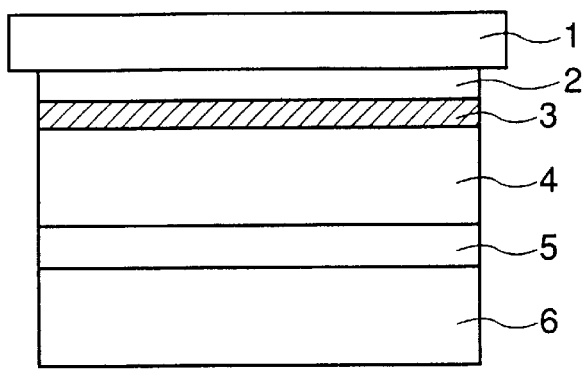
FIG. 4 is a schematic sectional view of the major part of a photovoltaic device having a conventional p-layer structure for comparison with the photovoltaic device in accordance with the present invention about the I-V characteristic.

For comparison, produced was a photovoltaic device having the same construction as the above-described photovoltaic device except a single p-layer of 10 nm thickness formed by use of mixed gases of $SiH_4:B_2H_6:H_2=100:5:200$ in place of the highly doped p-type a-Si:H layer 7 and the p-type a-Si:H layer 8, as shown in FIG. 4.

Figure 3:
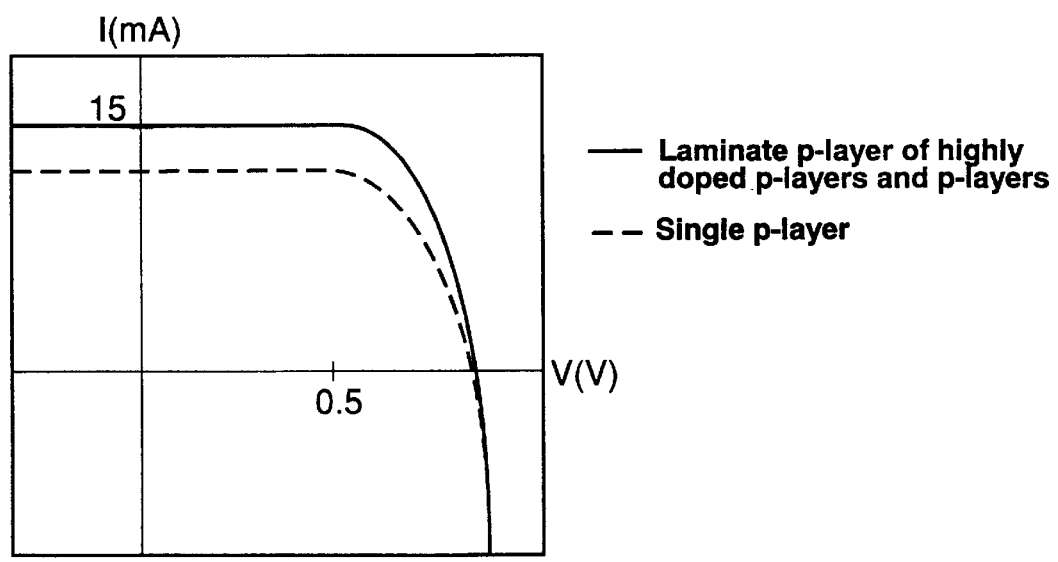
FIG. 3 is a graphic representation of an I-V characteristic of the photovoltaic device shown in FIG. 2.

FIG. 3 shows the I-V characteristic of these photovoltaic devices at A.M. 1.5.

As clearly shown in FIG. 3, the photovoltaic device of Embodiment 2 exhibits a relatively large short-circuit current of 15.0 mA/cm² because the light absorption of the p-layer is small as shown in the aforesaid Embodiment 1. It is also considered from Voc=0.85 V and F.F.=0.65 that the p-layer of this embodiment has a sufficient carrier density.

On the other hand, the comparative photovoltaic device having the single p-layer is found to have an insufficient short-circuit current of 13.2 mA/cm² as compared with the photovoltaic device of Embodiment 2 because the light absorption of the single p-layer is large as shown in Embodiment 1.

Embodiment 3
Evaluation of Light Absorption of p-layer

In the same manner and by use of the same kind of substrate as in Embodiment 1, an a-Si:H layer of about 10 nm thickness was formed on a highly doped p-type a-Si:H layer of about 2 nm thickness. Subsequently, the surface of the a-Si:H layer was subjected to a plasma treatment using helium gas under the conditions shown in Table 2. These steps were repeated until a p-layer having a total thickness of 300 nm was obtained.

TABLE 2

| Gas Type | Gas Flow Rate (sccm) | Applied Pressure (torr) | Applied Power (W) | Treatment Time (minutes) |
|---|---|---|---|---|
| He | 100 | 1.0 | 100 | 1 |

The light absorption of the obtained p-layer was measured. The results are shown in FIG. 5.

Figure 5:
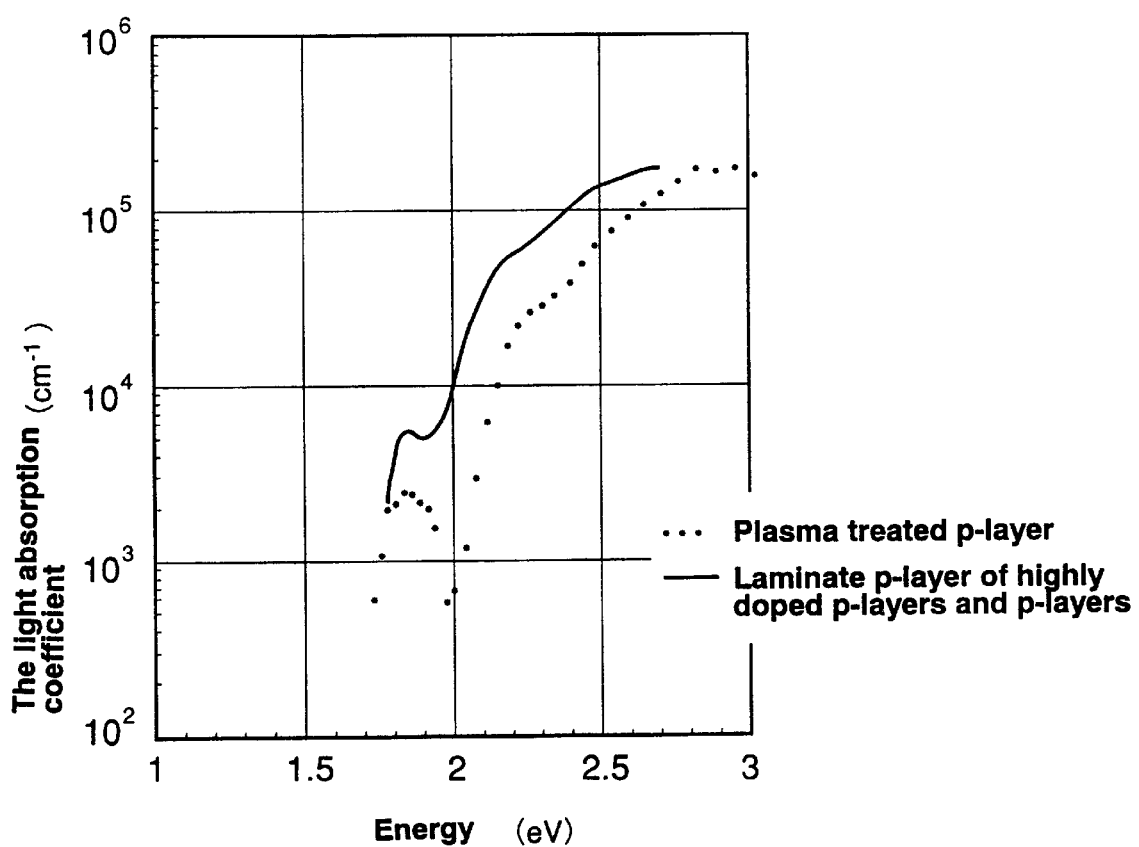
FIG. 5 is a graphic representation of light absorption of p-layers for use in another photovoltaic device in accordance with the present invention.

FIG. 5 clearly shows that the light absorption is further reduced by the plasma treatment as compared with the laminate p-layer composed of the highly doped p-layers and the p-layers of Embodiment 1.

In this embodiment, a unit of one highly doped p-layer and one p-layer in the laminate p-layer was set to be about 10 nm in thickness and the highly doped p-layers were present every approximate 10 nm. The plasma treatment was conducted in every unit. In the case where one p-layer (the second p-layer) was about 30 nm or thinner, the effect of reducing the light absorption and a conductivity similar to the above embodiment were observed.

Embodiment 4
Photovoltaic Device and its Production Process

Figure 6:
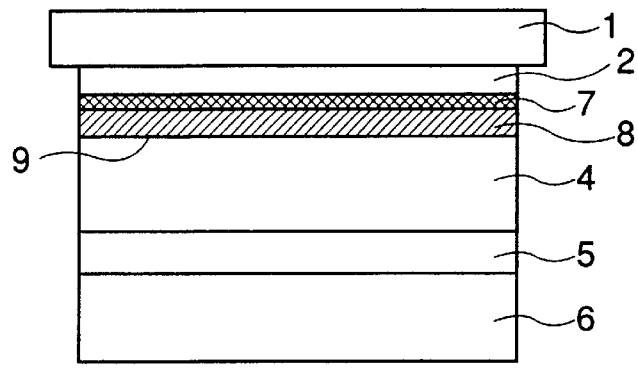
FIG. 6 is a schematic sectional view of the major part of another exemplary photovoltaic device in accordance with the present invention.

Referring to FIG. 6, the photovoltaic device of this embodiment was constructed to have a transparent electrode layer 2, a highly doped p-type a-Si:H layer 7, a p-type a-Si:H layer 8, an i-layer 4, an n-layer 5 and a rear electrode layer 6 sequentially formed on a transparent glass substrate 1 and to have a plasma-treated face 9 on the p-type a-Si:H layer 8.

The process for producing the above-described photovoltaic device of this embodiment is now explained.

First, the highly doped p-type a-Si:H layer 7 and the a-Si:H layer 8 were formed on the transparent glass substrate 1 in the same manner as in Embodiment 2. The transparent glass substrate 1 had on its surface a ZnO film having projections and depressions as in Embodiment 2.

Subsequently, the surface of the a-Si:H layer 8 was subjected to a plasma treatment using hydrogen gas under the conditions shown in Table 3.

TABLE 3

| Gas Type | Gas Flow Rate (sccm) | Applied Pressure (torr) | Applied Power (W) | Treatment Time (minutes) |
|---|---|---|---|---|
| $H_2$ | 100 | 0.8 | 200 | 1 |

Subsequently, in the same manner as in Embodiment 2, the i-layer 4, the n-layer 5 and the rear electrode 6 were formed on the a-Si:H layer 8. The photovoltaic device shown in FIG. 6 was thus obtained.

The I-V characteristic of the obtained photovoltaic device was evaluated.

Figure 7:
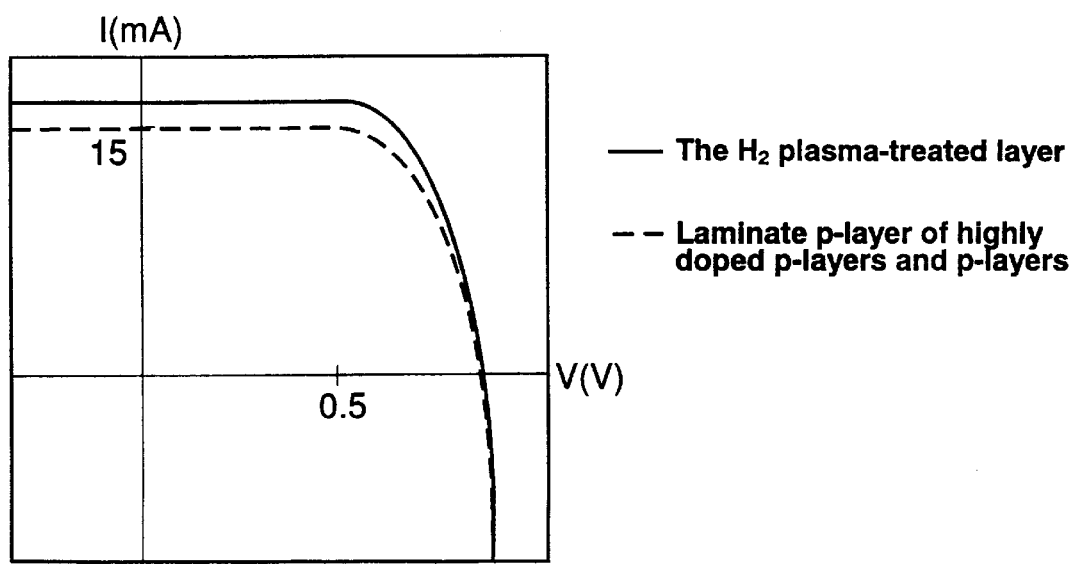
FIG. 7 is a graphic representation of the I-V characteristic of the photovoltaic device shown in FIG. 6.

FIG. 7 shows the I-V characteristic of this photovoltaic device at A.M. 1.5. FIG. 7 also shows the I-V characteristic of the photovoltaic device obtained in Embodiment 2 for comparison.

It is clear from FIG. 7 that the photovoltaic device of this Embodiment 4 exhibits a large short-circuit current of 16.0 mA/cm² because the light absorption of the p-layer is small as shown in Embodiment 3. It is also considered from Voc=0.9V and F.F.=0.68 that the p-layer of this embodiment has a sufficient carrier density.

Embodiment 5
Photovoltaic Device and its Production Process

The photovoltaic device of this embodiment was constructed to have a transparent electrode layer, a highly doped p-type a-Si:H layer, a p-type a-Si:H layer, an i-layer, an n-layer and a rear electrode layer sequentially formed on a transparent glass substrate and to have a plasma-treated face on the highly doped p-type a-Si:H layer.

The process for producing the above-described photovoltaic device of this embodiment is now explained.

First, the highly doped p-type a-Si:H layer was formed on the transparent glass substrate 1 in the same manner as in Embodiment 2. The transparent glass substrate 1 had on its surface a ZnO film having projections and depressions as in Embodiment 2. Thereafter, the surface of the highly doped p-type a-Si:H layer was subjected to a plasma treatment using hydrogen gas under the conditions shown in Table 3.

Subsequently, the a-Si:H layer, the i-layer, the n-layer and the rear electrode were formed on the highly dope p-type a-Si:H layer. The photovoltaic device was thus obtained.

The evaluation of the I-V characteristic of the obtained photovoltaic device in Embodiment 5 shows a short-circuit current of as large as 16.5 mA/cm$^2$. It is also considered from Voc=0.9V and F.F.=0.68 that the p-layer has a sufficient carrier density.

Embodiment 6
Photovoltaic Device and its Production Process

Figure 8:
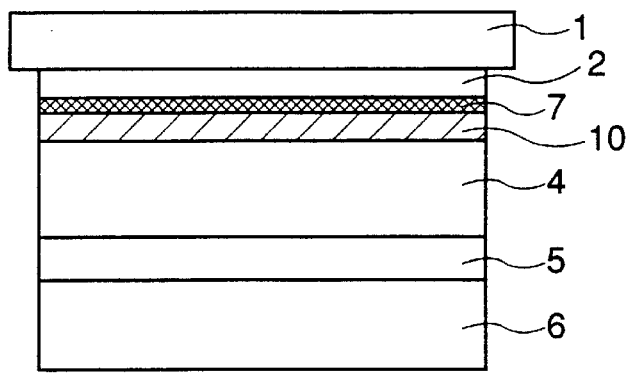
FIG. 8 is a schematic sectional view of the major part of still another exemplary photovoltaic device in accordance with the present invention.

Referring to FIG. 8, the photovoltaic device of this embodiment is constructed to have a transparent electrode layer 2, a highly doped p-type a-Si:H layer 7, a p-type layer 10 which was subjected to a plasma treatment in a graded manner, an i-layer 4, an n-layer 5 and a rear electrode layer 6 sequentially formed on a transparent glass substrate 1 and further to have plasma-treated faces on the highly doped p-type a-Si:H layer 7 as well as in and on the gradedly plasma-treated layer 10.

The process for producing the above-described photovoltaic device is now described.

First, the highly doped p-type a-Si:H layer 7 was formed on the transparent glass substrate 1 in the same manner as in Embodiment 2. The transparent glass substrate 1 had on its surface a ZnO film having projections and depressions as in Embodiment 2. The surface of the highly doped p-type a-Si:H layer 7 was subjected to a plasma treatment using hydrogen gas in the same manner as in Embodiment 5.

Subsequently, an i-layer of 3 nm thickness was formed in the same chamber that was used for forming the highly doped p-type a-Si:H layer 7, and was subjected to a plasma treatment using H$_2$ at 50 W for a minute under the conditions shown in Table 2. Then another i-layer of 3 nm thickness was formed thereon and subjected to a plasma treatment using H$_2$ at 20 W for a minute under the conditions shown in Table 3. Thereby, these two i-layers turned into the gradedly plasma-treaded p-type layer 10 due to the mixing of boron in the atmosphere.

Next, the i-layer 4 of 200 nm thickness was formed in an i-layer forming chamber.

Thereafter, the n-layer 5 of 30 nm thickness was formed in an n-layer forming chamber. Subsequently, the rear electrode 6 was formed, thereby to obtain the photovoltaic device shown in FIG. 8.

The I-V characteristic of the obtained photovoltaic device was evaluated.

Figure 9:
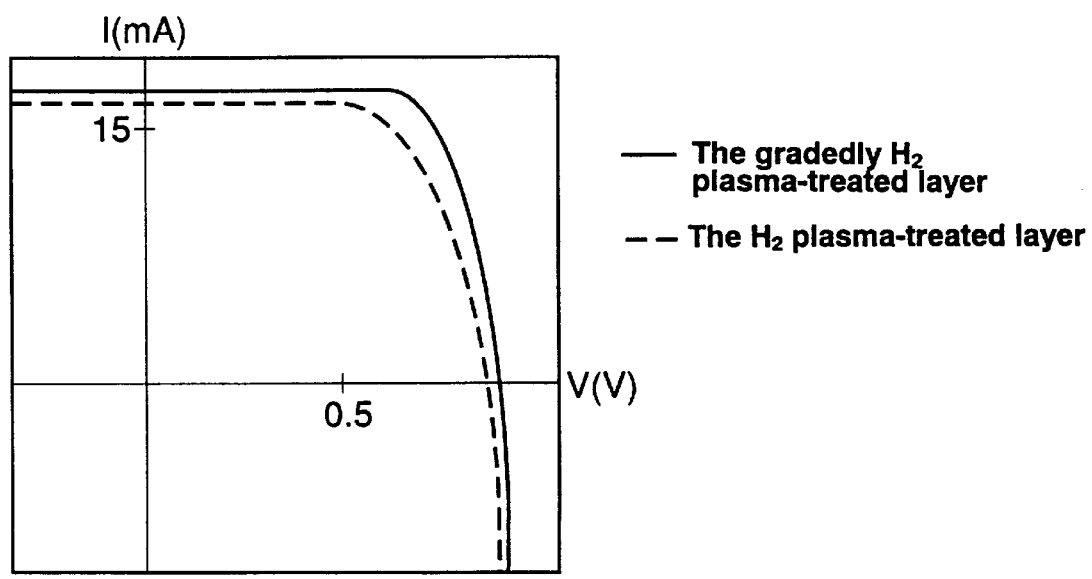
FIG. 9 is a graphic representation of the I-V characteristic of the photovoltaic device shown in FIG. 8.

FIG. 9 shows the I-V characteristic of this photovoltaic device at A.M. 1.5. For comparison, FIG. 9 also shows the I-V characteristic of the photovoltaic device obtained in Embodiment 3 in which the uppermost surface of the a-Si:H layer 8 was subjected to a plasma treatment using hydrogen for comparison.

As clearly shown in FIG. 9, the photovoltaic device of Embodiment 6 exhibits a large short-circuit current of 16.5 mA/cm$^2$ similarly to the above-described Embodiment 5 and also the p-layer has a sufficient carrier density since Voc is 0.92 V and F.F. is 0.73.

Embodiment 7

Figure 10:
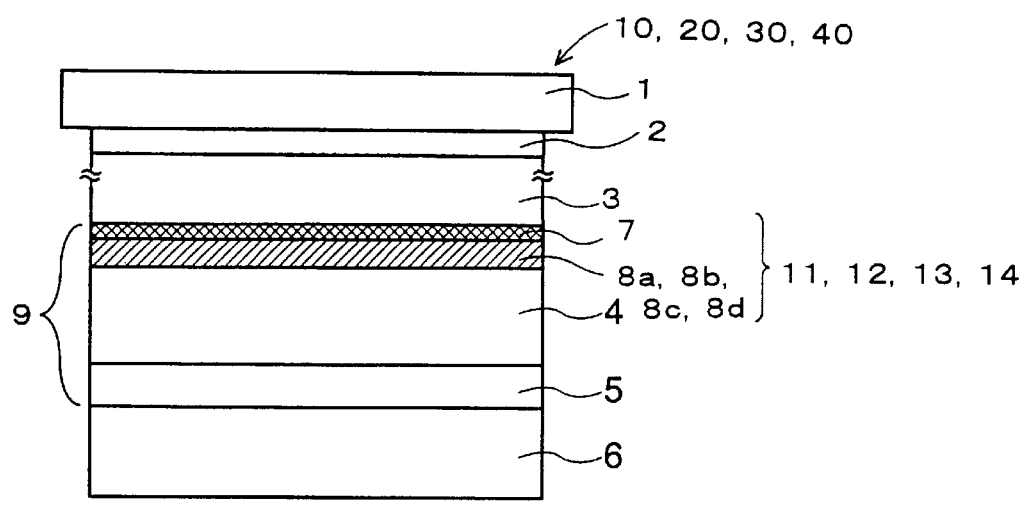
FIG. 10 is a schematic sectional view of the major part of an exemplary tandem-type photovoltaic device in accordance with the present invention.

In this embodiment, a tandem-type photovoltaic device 10 is comprised of a transparent electrode layer 2, a first pin junction 3, a second pin junction 9 composed of a p-layer 11, an i-layer 4 and an n-layer 5, and a rear electrode layer 6 sequentially formed on a transparent glass substrate 1, as shown in FIG. 10. The p-layer 11 includes a first p-layer 7 and a second p-layer 8a.

The process of producing the tandem-type photovoltaic device 10 is now explained.

First, on a substrate support in a p-layer forming chamber of a plasma-CVD apparatus, placed was the transparent glass substrate 1 provided with the transparent electrode layer 2 of ZnO having depressions and projections. The first pin junction 3 was formed on the substrate 1.

Onto a n-layer of the first pin junction 3, gas sources of SiH$_4$:B$_2$H$_6$:H$_2$=1:0.1:20 were supplied at a flow rate of 200 sccm. At this time, the film-forming temperature, the temperature of the substrate, the applied voltage and film-forming time period were set to 200° C., 200° C., 200 W and about one minute, respectively. Thus a highly doped p-type a-Si:H layer which was doped with boron in a high concentration was formed as the first p-layer 7. The thickness of the obtained highly doped p-type a-Si:H layer was set such that the light absorption of this layer could be neglected, i.e., about 3 nm in this embodiment. Here, the film-forming time period of the highly doped p-type a-Si:H layer was set such that boron would mix sufficiently into the underlying n-layer and a good ohmic contact could be obtained with the underlying n-layer (i.e., the above-mentioned one minute).

Subsequently, an a-Si:H layer which was not doped with boron was formed to a thickness of about 10 nm in the same chamber using gas sources of SiH$_4$:H$_2$=100:200 sccm. At this time, this a-Si:H layer was all changed into a p-layer to form the second p-layer 8a by boron diffusing from the highly doped p-type a-Si:H layer, i.e., the first p-layer 7, which lay under this a-Si:H layer or by boron mixing into this a-Si:H layer from an atmosphere in the chamber.

Next, on the p-layer (the hydrogenated amorphous p-type silicon layer) composed of this laminated first p-layer 7 and second p-layer 8a, the i-layer 4 was formed to a thickness of about 200 nm in an i-layer forming chamber using gas sources of SiH$_4$:H$_2$=200:500 sccm at an applied voltage of 100 W.

Further, on the i-layer 4, the n-layer 5 was formed to a thickness of about 30 nm in an n-layer forming chamber using gas sources of SiH$_4$:H$_2$:PH$_3$=10:500:3 at an applied voltage of 100 W. Thus the second pin junction 9 was formed. Subsequently, on the n-layer 5 of the second pin junction 9, an Ag film was formed to a thickness of about 500 nm by a sputtering apparatus at a film-forming temperature of 200° C., thereby to form the rear electrode layer 6. The tandem-type photovoltaic device 10 was thus produced.

Embodiment 8

In this embodiment, a tandem-type photovoltaic device 20 is comprised of a transparent electrode layer 2, a first pin junction 3, a second pin junction 9 composed of a p-layer 12, an i-layer 4 and an n-layer 5, and a rear electrode layer 6 sequentially formed on a transparent glass substrate 1, as shown in FIG. 10. In this embodiment, the p-layer 12 includes a first p-layer 7 and a second p-layer 8b. While the second player 8b is being formed, a resulting surface of the second player 8b is subjected to a plasma treatment every time the second p-layer 8b gains a predetermined thickness.

The process of producing the tandem-type photovoltaic device 20 is now explained.

First, on a substrate support in a p-layer forming chamber of a plasma-CVD apparatus, placed was the transparent glass substrate 1 provided with the transparent electrode layer 2 of ZnO having depressions and projections. The first pin junction 3 of a-Si:H was formed on the substrate 1. Onto the n-layer of the first pin junction 3, gas sources of $SiH_4:B_2H_6:H_2=1:0.1:20$ were supplied at a flow rate of 200 sccm. At this time, the film-forming temperature, the temperature of the substrate, the applied voltage and the film-forming time period were set to 200° C., 200° C., 200 W and about one minute, respectively. Thus a highly doped p-type a-Si:H layer which was doped with boron in a high concentration was formed as the first p-layer 7. The thickness of the obtained highly doped p-type a-Si:H layer was set such that the light absorption of this layer could be neglected, i.e., about 3 nm in this embodiment.

Subsequently, an a-Si:H layer which was not doped with boron was formed to a thickness of about 10 nm in the same chamber using gas sources of $SiH_4:H_2=100:200$ sccm. At this time, this a-Si:H layer was all changed into a p-layer to form the second p-layer 8b by boron diffusing from the highly doped p-type a-Si:H layer which lay under this a-Si:H layer or by boron mixing into this a-Si:H layer from an atmosphere in the chamber.

In this embodiment, while the second p-layer 8b was being formed to a thickness of about 10 nm on the obtained first p-layer 7, a $H_2$ plasma treatment was carried out for three minutes every time the second p-layer 8b under formation gained a thickness of 3 nm in order that loss by light absorption of the second p-layer 8b might be reduced.

Next, on the obtained p-layer 12, formed were an i-layer 4 and an n-layer 5 in substantially the same manner as in the case of the aforesaid photovoltaic device 10, thereby to form the second pin junction 9. Subsequently, the rear electrode layer 6 was formed on the n-layer 5 of the second pin junction 9, and the tandem-type photovoltaic device 20 was produced.

Embodiment 9

In this embodiment, a tandem-type photovoltaic device 30 is comprised of a transparent electrode layer 2, a first pin junction 3, a second pin junction 9 composed of a p-layer 13, an i-layer 4 and an n-layer 5, and a rear electrode layer 6 sequentially formed on a transparent glass substrate 1, as shown in FIG. 10. In this embodiment, the p-layer 13 includes a first p-layer 7 and a second p-layer 8c. While the second player 8c is being formed, a resulting surface of the second player 8c is subjected to a plasma treatment with the treatment time and/or voltage to be applied being decreased every time the second p-layer 8c under formation gains a predetermined thickness.

The process of producing the tandem-type photovoltaic device 30 is now explained.

First, on a substrate support in a p-layer forming chamber of a plasma-CVD apparatus, placed was the transparent glass substrate 1 provided with the transparent electrode layer 2 of ZnO having depressions and projections. The first pin junction 3 of a-Si:H was formed on the substrate 1. Onto the n-layer of the first pin junction 3, gas sources of $SiH_4:B_2H_6:H_2=1:0.1:20$ were supplied at a flow rate of 200 sccm. At this time, the film-forming temperature, the temperature of the substrate, the applied voltage and the film-forming time period were set to 200° C., 200° C., 200 W and about one minute, respectively. Thus a highly doped p-type a-Si:H layer which was doped with boron in a high concentration was formed as the first p-layer 7. The thickness of the obtained highly doped p-type a-Si:H layer was set such that the light absorption of this layer could be neglected, i.e., about 3 nm in this embodiment.

Subsequently, an a-Si:H layer which was not doped with boron was formed to a thickness of about 10 nm in the same chamber using gas sources of $SiH_4:H_2=100:200$ sccm. At this time, this a-Si:H layer was all changed into a p-layer to form the second p-layer 8c by boron diffusing from the highly doped p-type a-Si:H layer which lay under this a-Si:H layer or by boron mixing into this a-Si:H layer from an atmosphere in the chamber.

In this embodiment, while the second p-layer 8c was being formed to a thickness of about 10 nm on the obtained first p-layer 7, a $H_2$ plasma treatment was carried out for five minutes by reducing the applied voltage every time the second p-layer 8c under formation gained a thickness of 3 nm in order that loss by light absorption of the second p-layer 8c might be reduced. More particularly, a-Si:H was deposited to about 3 nm on the first p-layer 7, and then the $H_2$ plasma treatment was conducted at an applied voltage of 300 W for five minutes. Subsequently, a-Si:H was deposited to about 3 nm again, and then the $H_2$ plasma treatment was conducted at an applied voltage of 200 W for five minutes. Subsequently, a-Si:H was deposited to about 3 nm, and then the $H_2$ plasma treatment was conducted at an applied voltage of 100 W for five minutes. Thereby the second p-layer 8c having a thickness of about 10 nm was formed.

Next, on the obtained p-layer 13, formed were an i-layer 4 and an n-layer 5 in substantially the same manner as described above, thereby to form the second pin layer 9. Subsequently, the rear electrode layer 6 was formed on the n-layer 5 of the second pin junction 9, and the tandem-type photovoltaic device 30 was produced.

Though the plasma treatment was conducted by reducing the treatment voltage gradually while keeping the treatment time constant in this embodiment, the treatment time period may be reduced gradually while keeping the treatment voltage constant or both the plasma treatment time and the treatment voltage may be reduced gradually.

Embodiment 10

In this embodiment, a tandem-type photovoltaic device 40 is comprised of a transparent electrode layer 2, a first pin junction 3, a second pin junction 9 composed of a p-layer 14, an i-layer 4 and an n-layer 5, and a rear electrode layer 6 sequentially formed on a transparent glass substrate 1, as shown in FIG. 10. In this embodiment, the p-layer 14 includes a =first p-layer 7 and a second p-layer 8d. After the first p-layer 7 is formed, the resulting surface of the first p-layer 7 is subjected to a plasma treatment.

The process of producing the tandem-type photovoltaic device 40 is now explained.

First, on a substrate support in a p-layer forming chamber of a plasma-CVD system, placed was the transparent glass substrate 1 provided with the transparent electrode layer 2 of ZnO having depressions and projections. The first pin junction 3 of a-Si:H was formed on the substrate 1. Onto the n-layer of the first pin junction 3, gas sources of $SiH_4:B_2:H_6:H_2=1:0.1:20$ were supplied at a flow rate of 200 sccm. At this time, the film-forming temperature, the temperature of the substrate, the applied voltage and the film-forming time period were set to 200° C., 200° C., 200 W and about one minute, respectively. Thus a highly doped p-type a-Si:H layer which was doped with boron in a high concentration was formed as the first p-layer 7. The thickness of the obtained highly doped p-type a-Si:H layer was set such that the light absorption of this layer could be neglected, i.e., about 3 nm in this embodiment.

Subsequently, in the same chamber, the surface of the first p-layer 7 was subjected to a plasma treatment using $H_2$, He or Ar gas under the conditions shown in the table 4.

TABLE 4

| Gas Type | Gas Flow Rate (sccm) | Applied Pressure (torr) | Applied Power (W) | Treatment Time (minutes) |
| --- | --- | --- | --- | --- |
| $H_2$ | 100 | 0.8 | 200 | 10 |
| He | 100 | 0.6 | 100 | 5 |
| Ar | 100 | 1.0 | 100 | 10 |

Subsequently, an a-Si:H layer which was not doped with boron was formed to a thickness of about 10 nm in the same chamber using gas sources of $SiH_4:H_2=100:200$ sccm. At this time, this a-Si:H layer was all changed into a p-layer to form the second p-layer 8d by boron diffusing from the highly doped p-type a-Si:H layer which lay under this a-Si:H layer or by boron mixing into this a-Si:H layer from an atmosphere in the chamber.

Next, on the obtained p-layer 14, formed were an i-layer 4 and an n-layer 5 in substantially the same manner as described above, thereby to form the second pin junction 9. Subsequently, the rear electrode layer 6 was formed on the n-layer of the second pin junction 9, and the tandem-type photovoltaic device 40 was produced.

COMPARATIVE EXAMPLE

For comparison, in addition to the above-described tandem-type photovoltaic devices 10, 20 30 and 40 of the invention, a conventional tandem-type photovoltaic device was produced which device had a second pin junction including a p-layer having a conventional contact layer (a highly doped p-type a-Si:H layer and a p-type a-SiC:H layer), the second pin junction being a part of layers formed on a transparent glass substrate.

An a-SiC:H layer highly doped with boron was formed by flowing a gas of $SiH_4:CH_4:B_2H_6=1:1:0.02$ at 200 sccm at an applied voltage of 200 W. Onto this p-type a-SiC:H film, a non-doped a-SiC:H film was deposited to a thickness of 10 nm, on which an 80 nm thick i-layer formed in an i-layer forming chamber and a 30 nm thick n-layer formed in an n-layer forming chamber were laminated, thereby to form a first pin-junction. On this first pin-junction, a highly doped p-layer which serves as a recombination layer is deposited to a thickness of 3 nm. Subsequently, by flowing a gas of $SiH_4:CH_4:B_2H_6=1:1:0.02$ at 200 sccm onto the highly doped p-layer, an a-SiC:H layer highly doped with boron was formed at an applied voltage of 200 W. On this p-type a-SiC:H film, a non-doped a-SiC:H film was deposited to a thickness of 10 nm, on which an 300 nm thick i-layer formed in an i-layer forming chamber and a 30 nm thick n-layer formed in an n-layer forming chamber were laminated, thereby to form a second pin-junction. Thereafter, a rear-side metal electrode was formed by sputtering. Thus a tandem-type device (100) was produced for comparison.

Figure 11:
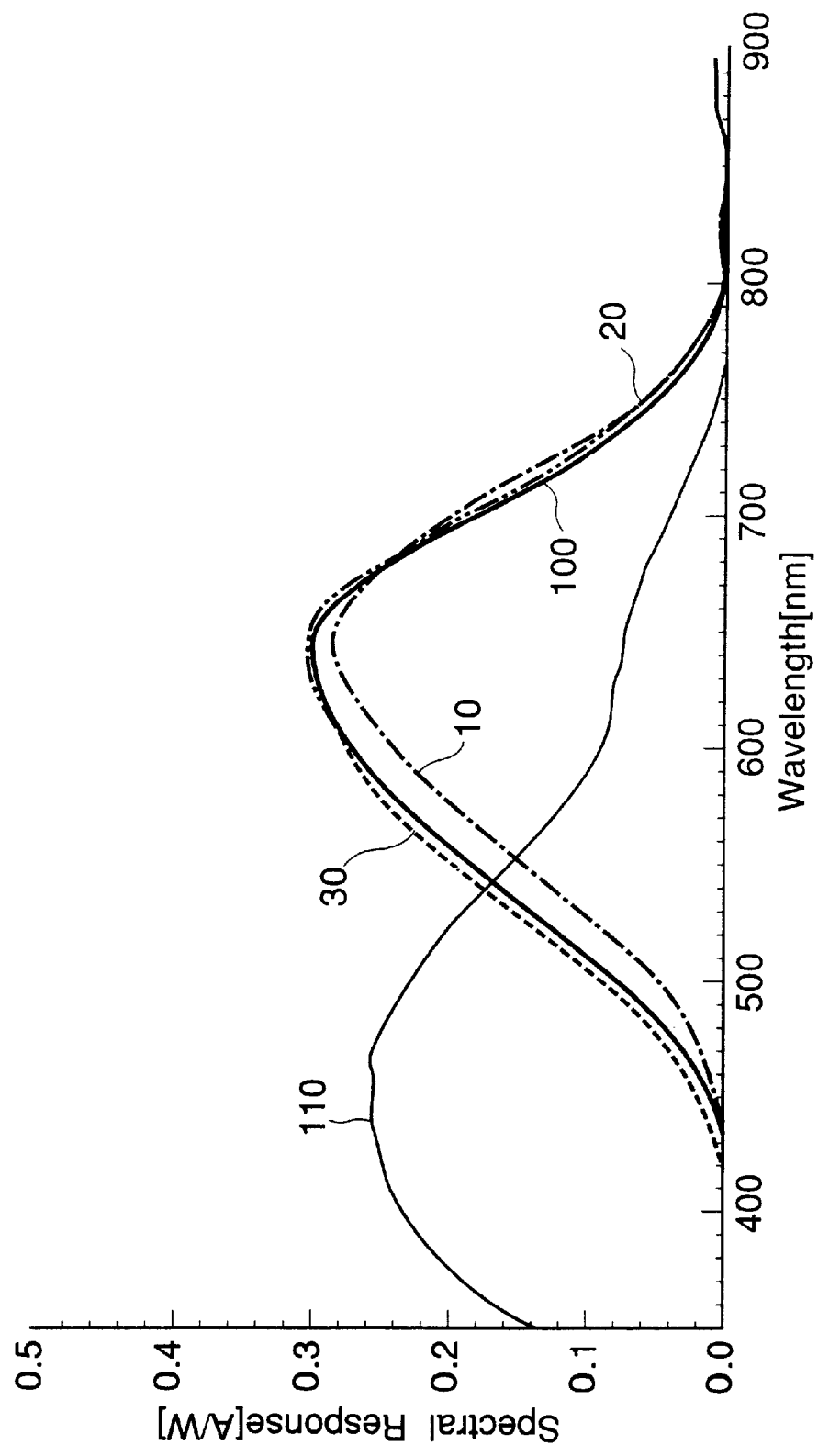
FIG. 11 is a graphic representation of spectral sensitivity characteristics of photovoltaic devices in accordance with the present invention and a conventional photovoltaic device.

Spectral sensitivity characteristics of this conventional tandem-type photovoltaic device and those of the present invention 10, 20 and 30 were determined. The results are shown in FIG. 11, which shows that, in the tandem-type photovoltaic devices of the present invention 10, 20 and 30, the bottom cell have a spectral sensitivity comparable to that of the cell using the p-type a-SiC:H layer. In FIG. 11, line 110 shows characteristics of upper connectors in these photovoltaic devices.

Comparing the I-V characteristic of the tandem-type photovoltaic device 10 with that of the tandem-type photovoltaic device with the conventional contact layer and p-type a-SiC:H layer, a Voc and an F.F. substantially equal to those of the conventional one were ensured. That showed that an inner electric field of the n-layer was able to be ensured without problems on the ohmic connection with the n-layer.

In the tandem-type photovoltaic device 20, the contact between the p-layer and the n-layer was also found to be good since the F.F. was larger than 0.7.

Figure 12:
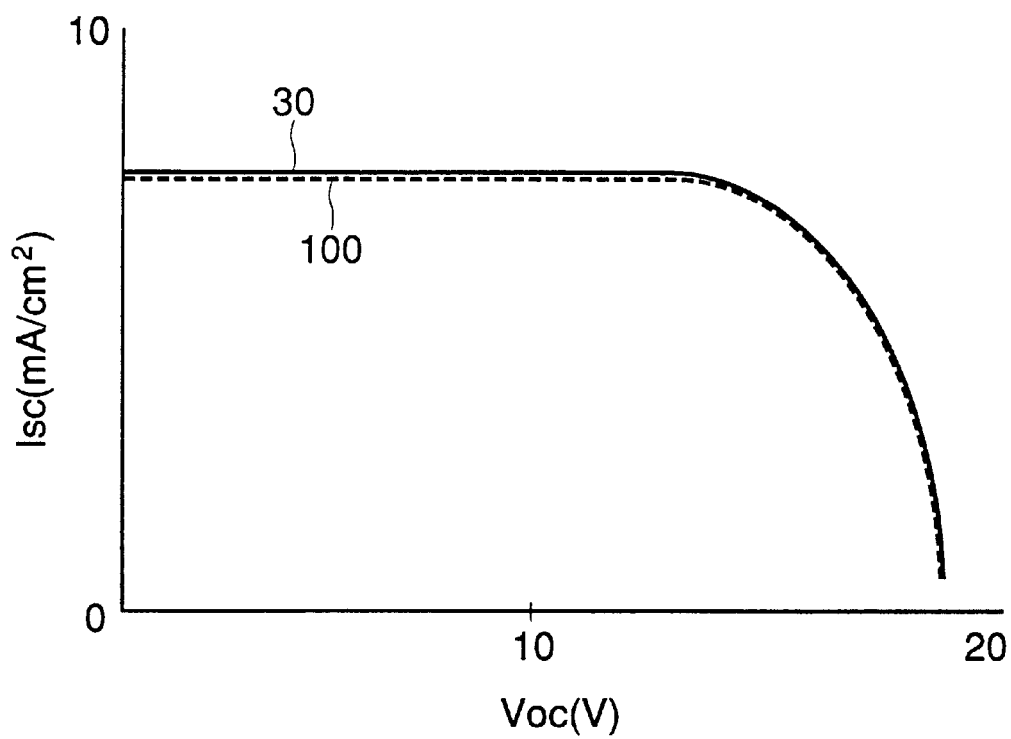
FIG. 12 is a graphic representation of the I-V characteristics of photovoltaic devices in accordance with the present invention and a conventional photovoltaic device.

Results of determination of the I-V characteristics of the photovoltaic device 30 of the present invention and the above-described conventional tandem-type photovoltaic device are shown in FIG. 12.

As clearly shown in FIG. 12, the short-circuit current of the tandem-type photovoltaic device 30 of Embodiment 9 exhibited a value equal to or a littler larger than that of the conventional tandem-type photovoltaic device because the player of the tandem-type photovoltaic device 30 had a small light absorption. Also as clearly seen from the Voc, the density of the carrier in the p-layer was sufficient. Furthermore, in the tandem-type photovoltaic device 30, an adverse effect on the pi interface was able to be suppressed by easing the conditions of the plasma treatment as the p-layer becomes closer to the i-layer, which results in a decreased recombination at the interface and an improved F.F., given that the F.F. was larger than 0.74.

According to the present invention, the p-layer which composes the photovoltaic device having the pin junction is a laminate of the first p-layer having a thickness of 5 nm or less which is uniformly doped with the p-type impurity and the second p-layer which is formed by the decomposition of a gas not containing a p-type impurity. Accordingly, the light absorption in the p-layer is small. Also hydrogen atoms are prevented from being drawn from the semiconductor layer composing the p-layer by the impurity within the p-layer and thereby a high conductivity is ensured. Furthermore, the p-layer has good interfacial characteristics with both the underlying and overlying transparent oxide film and photoelectric conversion layer. In addition to the foregoing, without need to give great changes to the conventional material for the p-layer, a sufficient inner electric field can be generated in the i-layer, a relatively large open-circuit voltage can be obtained and a relatively large short-circuit current can be achieved because the increase of the light absorption is inhibited.

In the case where the second p-layer is composed of a plurality of layers which have greater light absorption coefficients as they are closer to the i-layer, a junction characteristic at the p-i interface can be improved, the F.F. and Voc can be prevented from decreasing, and the possibility that photocurrent recombines at the p-i interface can be decreased.

According to the present invention, also in the case where a plurality of pin junctions are formed, it is possible to realize p-layers in which the film characteristics are not deteriorated by the extraction of hydrogen atoms from silicon films by boron while good ohmic characteristics with underlying n-layers are ensured. As a result, a sufficient open-circuit voltage and an improved F.F. can be ensured.

Further, according to the present invention, the p-layer composing the photovoltaic device having the pin junction is formed by forming the first p-layer having a thickness of 5 nm or less which is uniformly doped with the p-type impurity and then forming the second p-layer on the first p-layer by decomposing a gas which does not contain a p-type impurity. Accordingly, it is possible to produce the above-described photovoltaic device easily without need to use either a special apparatus or a special process.

The light absorption of the p-layer can further be reduced by subjecting the surface of the first p-layer to the plasma treatment after the formation of the first p-layer, by subjecting the second p-layer to the plasma treatment every time the second p-layer under formation gains a predetermined thickness, or by conducting the plasma treatment at gradually decreased treatment power and/or for gradually decreased treatment time every time a predetermined thickness is gained.

Further, in the case where the first p-layer and the second p-layer are formed in the same chamber of the deposition system, it is possible to produce the above-described photovoltaic device easily without need to design a special doping profile, and therefore production costs may be greatly reduced.

Alternately, in the case where the first p-layer, the second p-layer and the i-layer are formed in different chambers of the deposition system, the p-type impurity does not diffuse excessively in the i-layer. Accordingly, the inner electric field in the i-layer can be easily controlled, which results in suppression of space charge within the i-layer. Therefore, efficiency of collecting photocurrent can be improved (F.F. can be prevented form declining).

What is claimed is:

1. A photovoltaic device comprising a pin junction of a player, an i-layer and an n-layer, wherein the p-layer includes a first p-layer and a second p-layer thereover, the first p-layer having a thickness of 5 nm or less and being uniformly doped with a p-type impurity, and the second p-layer being formed by decomposition of a gas which does not positively incorporate a p-type impurity;

wherein each of the first p-layer and the second p-layer comprises one of (a) hydrogenated amorphous silicon (a-Si:H), (b) hydrogenated amorphous germanium (a-Ge:H), and (c) hydrogenated amorphous silicon germanium (a-SiGe:H); and wherein the first p-layer is formed directly on a transparent electrode.

2. A photovoltaic device according to claim 1, wherein the second p-layer is p-type with a p-type impurity derived from any of the preformed first p-layer and a residue remaining in an apparatus when the second p-layer is formed in the same apparatus as used for the first p-layer.

3. A photovoltaic device according to claim 1, wherein the first p-layer is doped predominantly with the p-type impurity while it is also doped with a smaller amount of an n-type impurity than the p-type imprity, and the content of the p-type impurity in the second p-layer becomes lower as the second player is closer to the i-layer.

4. A photovoltaic device according to claim 1, wherein the photovoltaic device includes plural pin junctions, and wherein at least one p-layer adjacent to an n-layer includes a first p-layer which is doped predominantly with the p-type impurity while it is also doped with a smaller amount of an n-type impurity than the p-type impurity and which has a thickness of 5 nm or less, and a second p-layer in which the content of the p-type impurity becomes lower as the second p-layer is closer to the i-layer.

5. A photovoltaic device according to claim 4, wherein the at least one p-layer has a larger optical band gap on a side to the n-layer and a smaller optical band gap on a side to the i-layer.

6. A photovoltaic device according to claim 1, wherein the second p-layer comprises a plurality of layers having light absorption coefficients which are greater as the layers are closer to the i-layer.

7. A process for producing a photovoltaic device having a pin junction of a p-layer, an i-layer and an n-layer, the process comprising:

forming a first p-layers which has a thickness of 5 nm or less and is uniformly doped with a p-type impurity, directly on a transparent electrode;

forming a second p-layer by decomposition of a gas which does not positively incorporate a p-type impurity, thereby to obtain the second p-layer, wherein each of the first p-layer and the second p-layer of the p-layer each comprises one of: (a) hydrogenated amorphous silicon (a-Si:H), (b) hydrogenated amorphous germanium (a-Ge:H), and (c) hydrogenated amorphous silicon germanium (a-SiGe:H); and forming the i-layer and n-layer in this order.

8. A process according to claim 7, wherein the second player is p-type with a p-type impurity derived from any of the preformed first p-layer and a residue remaining in an apparatus when the second p-layer is formed in the same apparatus as used for the first p-layer.

9. A process according to claim 7, wherein a surface of the first p-layer is subjected to a plasma treatment after the first p-layer is formed.

10. A process according to claim 7, wherein when the second p-layer gains a thickness during formation thereof, a resulting surface of the second p-layer is subjected to a plasma treatment.

11. A process according to claim 9, wherein the plasma treatment is conducted in such a manner that the treatment time and/or power to be applied is/are decreased every time a predetermined thickness is gained.

12. The process according to claim 7, wherein the first p-layer and the second p-layer are formed in the same chamber of a film-forming apparatus.

13. The process according to claim 7, wherein the i-layer is formed in a different chamber of a film-forming apparatus from a chamber for forming the first p-layer and the second p-layer.

14. A photovoltaic device comprising a pin junction of a p-layer, an i-layer and an n-layer, wherein the p-layer includes a first p-layer and a second p-layer thereover, the first p-layer having a thickness of 5 nm or less and being uniformly doped with a p-type impurity, and the second p-layer being formed by decomposition of a gas which does not positively incorporate a p-type impurity; and wherein the second p-layer comprises a plurality of layers having light absorption coefficients which are greater as the layers are closer to the i-layer.

* * * * *

UNITED STATES PATENT AND TRADEMARK OFFICE
CERTIFICATE OF CORRECTION

PATENT NO.    : 6,242,686 B1
DATED         : July 23, 2002
INVENTOR(S)   : Hutchins et al.

It is certified that error appears in the above-identified patent and that said Letters Patent is hereby corrected as shown below:

Column 8,
Lines 5-6,    Change "$DJ_k = -DJ_{k-1} + 2(\mu_2 - \mu_1) y_k + (\mu_2^2 + \mu_1^2)$"

to -- $DJ_k = -DJ_{k-1} + 2(\mu_2 - \mu_1) y_k + (-\mu_2^2 + \mu_1^2)$ --

Column 12,
Lines 13-16, Change "$Y_k \varepsilon \{a_0f_0+a_0f_1+a_0f_2=\mu_0, a_0f_0+a_0f_1+a_1f_2=\mu_1, a_1f_0+a_1f_1+a_1f_2=\mu_3, a_1f_0+a_0f_1+a_0f_2=\mu_4, a_1f_0+a_1f_1+a_0f_2=\mu_6, a_1f_0+a_1f_1+a_1f_2=\mu_7\}$"

to -- $Y_k \varepsilon \{a_0f_0+a_0f_1+a_0f_2=\mu_0, a_0f_0+a_0f_1+a_1f_2=\mu_1, a_1f_0+a_1f_1+a_1f_2=\mu_3, a_1f_0+a_0f_1+a_0f_2=\mu_4, a_1f_0+a_1f_1+a_0f_2=\mu_6, a_1f_0+a_1f_1+a_1f_2=\mu_7\}$ --

Column 14,
Line 38, change "BV" to -- By --

Signed and Sealed this

Eleventh Day of March, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,242,686 B1
DATED        : June 5, 2001
INVENTOR(S)  : Katsushi Kishimoto et al.

It is certified that error appears in the above-identified patent and that said Letters Patent is hereby corrected as shown below:

This certificate supersedes Certificate of Correction issued March 11, 2003, the number was erroneously mentioned and should be vacated since no Certificate of Correction was granted.

Signed and Sealed this

Fifteenth Day of April, 2003

JAMES E. ROGAN
*Director of the United States Patent and Trademark Office*